(12) United States Patent  
Ogatsu (10) Patent No.: US 8,377,543 B2  
(45) Date of Patent: Feb. 19, 2013

(54) MULTILAYER-WIRED SUBSTRATE

(75) Inventor: Toshinobu Ogatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 576 days.

(21) Appl. No.: 12/514,365

(22) PCT Filed: Oct. 9, 2007

(86) PCT No.: PCT/JP2007/069673  
§ 371 (c)(1),  
(2), (4) Date: May 11, 2009

(87) PCT Pub. No.: WO2008/056500  
PCT Pub. Date: May 15, 2008

(65) Prior Publication Data  
US 2010/0051327 A1    Mar. 4, 2010

(30) Foreign Application Priority Data  
Nov. 10, 2006    (JP) .................................. 2006-305803

(51) Int. Cl.  
*B32B 9/00* (2006.01)
(52) U.S. Cl. ........ 428/209; 442/189; 442/205; 442/210; 174/255; 174/258
(58) Field of Classification Search .................. 428/209, 428/901; 442/189, 226, 205, 210; 174/255, 174/258  
See application file for complete search history.

(56) References Cited

U.S. PATENT DOCUMENTS

| | | | | |
|---|---|---|---|---|
| 4,368,234 A | * | 1/1983 | Palmer et al. | 442/186 |
| 4,591,659 A | * | 5/1986 | Leibowitz | 174/256 |
| 4,609,586 A | * | 9/1986 | Jensen et al. | 428/209 |
| 4,820,568 A | * | 4/1989 | Harpell et al. | 428/113 |
| 4,875,282 A | * | 10/1989 | Leibowitz | 29/830 |
| 5,275,877 A | * | 1/1994 | Isayev | 428/299.7 |
| 5,633,072 A | * | 5/1997 | Middelman et al. | 428/209 |

FOREIGN PATENT DOCUMENTS

| | | |
|---|---|---|
| JP | 1982134867 A | 8/1982 |
| JP | 1989283996 A | 11/1989 |
| JP | 2000151047 A | 5/2000 |
| JP | 2003062945 A | 3/2003 |
| JP | 2004263112 A | 9/2004 |

OTHER PUBLICATIONS

International Search Report for PCT/JP2007/069673 mailed Dec. 25, 2007.

* cited by examiner

*Primary Examiner* — Cathy Lam (57) ABSTRACT

Provided is a multilayer-wired substrate for mobile electric equipment, wherein the multilayer-wired substrate is very strong, includes a larger elastically deformable region and a higher elasticity than those of the conventional structure, and can be curved. The multilayer-wired substrate is a multilayer-wired substrate including one or more insulating layers. At least one insulating layer of the substrate is made of a material in which the mechanical characteristic in an in-plane direction component exhibits anisotropy.

5 Claims, 6 Drawing Sheets

MULTILAYER-WIRED SUBSTRATE

This application is the National Phase of PCT/JP2007/069673, filed Oct. 9, 2007, which claims priority to Japanese Patent Application No. 2006-305803, filed on Nov. 10, 2006, which is incorporated herein by reference in its entirety.

TECHNICAL FIELD

The present invention relates to a multilayer-wired substrate (multilayer printed board) made of a prepreg and a copper-clad laminate.

BACKGROUND ART

About electronic equipment such as laptop computers, reproduction equipment for video and music, and game machines as well as mobile phones and handheld information terminals, scenes to carry increase. It is necessary for these electronic equipment to ensure reliability in various use environments, and component packaging technology with high strength to vibration at the time of carrying, a load at the time of drop impact, or the like is demanded. On the other hand, development of high density packaging technology and thin packaging technology is strongly demanded because the number of components packaged in equipment increases to enhance functionality. In order to solve problems of densification and slim-thickness and to solve a contrary problem of an increase in strength, wide-ranging proposals about densification and slim-thickness have been made.

Among these, Japanese Patent Laid-Open No. 2003-62945 (Patent document 1) discloses a multilayer-wired substrate in which a fabric and a nonwoven fabric are used for the base of an insulating layer to ensure the strength of a printed board on which electronic components are mounted in the insulating layer of the substrate. Further, Japanese Patent Laid-Open No. 2004-263112 (Patent document 2) discloses a technology for reducing the thickness of an interlayer insulating layer configuring a multilayer-wired substrate.

Since the electronic equipment is mobile equipment, fitness with people is also strongly required. Because of this, a shape design of an equipment case is invented. In equipment like this, a substrate with a flexible structure, which is called a flexible wiring board, may be used in which a polyimide is mainly used for an insulating layer, as disclosed in Japanese Patent Laid-Open No. 2000-151047 (Patent document 3).

When mobile electronic equipment is designed so as to achieve the fitness with people, it is supposed that an equipment case is rounded or is formed in a cylindrical shape to put it on a wrist. In the inventions according to Patent documents 1 and 2, it is not thought that the multilayer wired substrate can be bent without causing damage when the substrate is applied to a curved surface of the above equipment case.

Patent documents 1 and 2 disclose that a material obtained by impregnating glass cloth or a nonwoven fabric with a resin for curing is used for respective insulating layers of the multilayer substrate. A mechanical characteristic of an in-plane direction component shows an isotropy in the material obtained by impregnating the glass cloth or the nonwoven fabric with resin for curing. Since this isotropic material is used for all interlayer insulating layers, the multilayer substrate is difficult to be bent and it has very high rigidity. In Addition, if the substrate becomes when it is fitted to a curved shape, it is possible that the insulating layer will crack which will cause the interlayer to lose its insulating properties. Accordingly, the multilayer-wired substrates according to Patent documents 1 and 2 are supposed to be used in a plane form. It is not thought that multilayer-wired substrates can be are used when their substrate surfaces are bent (curving the substrates).

In order to form a substrate into a curved shape as described above, a thin substrate has an advantage because of a circumferential difference between a concave side and a convex side of the curved substrate. However, the substrate itself must be rigid to ensure that it can be used for mobile electronic equipment. Compared with a multilayer rigid substrate, a substrate obtained by multi-layering of a flexible wiring board as shown in Patent document 3 (that is, a multilayer flexible substrate) uses a polyimide resin material for an insulating layer, and therefore, there is a problem of low rigidity in the substrate itself. Additionally, regarding the polyimide, there is also a problem that the cost of the material is high.

DISCLOSURE OF THE INVENTION

An object of the present invention is to provide a multilayer-wired substrate capable of solving any of the problems described above. The object, in one aspect, is to provide a multilayer-wired substrate for mobile electronic equipment, wherein the multilayer-wired substrate is very strong, includes a larger elastically deformable region and has higher elasticity than those of the structures disclosed in Patent documents 1 to 3, and can be curved. The object, in another aspect, is to enable reducing the thickness of the substrate and to maintain the insulating property of the interlayer.

The multilayer-wired substrate of the present invention is a multilayer-wired substrate including one or more insulating layers. At least one insulating layer of the substrate is made of a material in which the mechanical characteristic in an in-plane direction component exhibits anisotropy.

BRIEF DESCRIPTION OF THE DRAWINGS

FIG. 3 is a schematic view in the case of bending a multilayer-wired substrate which the exemplary embodiment is not applied to;

FIG. 4 is a schematic view in the case of bending the multilayer-wired substrate which the exemplary embodiment is applied to;

BEST MODE FOR CARRYING OUT THE INVENTION

Next, exemplary embodiments are described in detail with reference to the drawings.

Figure 1:
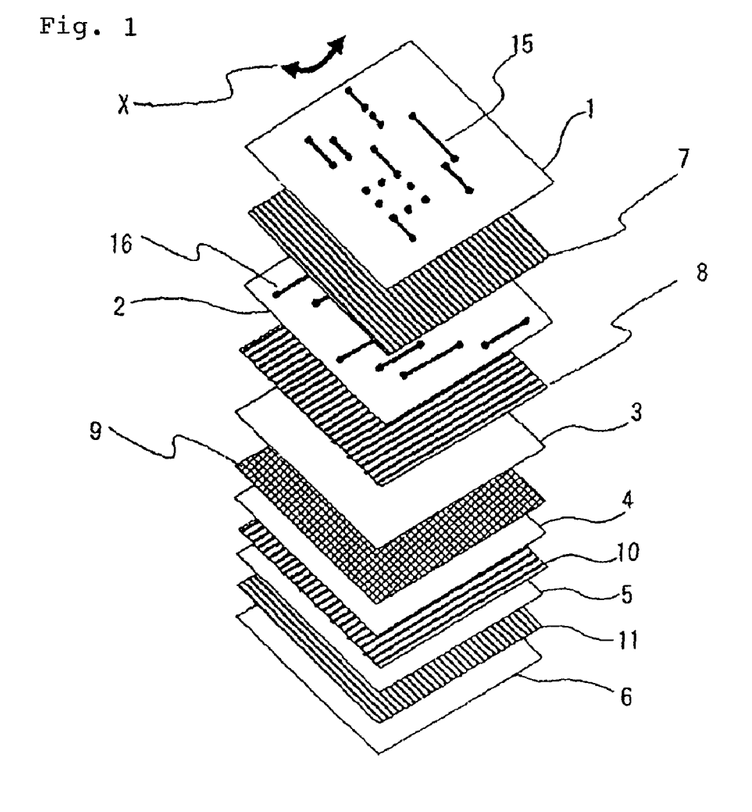
FIG. 1 is an exploded perspective view of a multilayer-wired substrate according to an exemplary embodiment.
Figure 2:
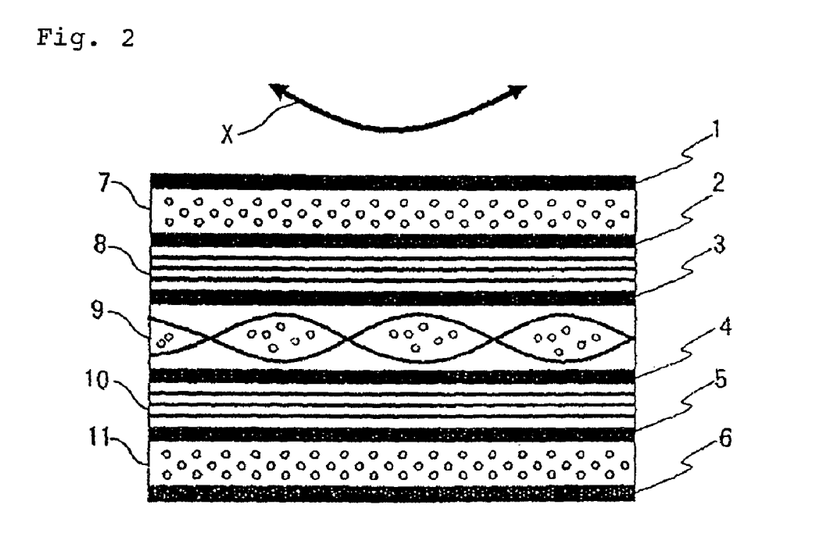
FIG. 2 is a sectional view of the multilayer-wired substrate according to the exemplary embodiment.

FIG. 1 is an exploded perspective view of a multilayer-wired substrate according to an exemplary embodiment. FIG. 2 is a sectional view of the multilayer-wired substrate according to the exemplary embodiment.

The exemplary embodiment employs a multilayer-wired substrate with six wiring layers. Accordingly, the substrate includes first conductive layer 1, second conductive layer 2, third conductive layer 3, fourth conductive layer 4, fifth conductive layer 5 and sixth conductive layer 6 in which wiring has been formed, and an insulating layer is interposed between the wiring layers adjacent to each other. The number of interposed insulating layers is five in total. An insulating layer between third conductive layer 3 and fourth conductive layer 4 (hereinafter, 3-4 insulating layer 9) in the substrate is a core layer in a center of the substrate.

A double-sided copper-clad resin board having copper foils laminated on both sides of a prepreg obtained by impregnating glass cloth with a resin is used for a laminate including 3-4 insulating layer 9, third conductive layer 3 and fourth conductive layer 4. The copper foils on both sides of the copper-clad resin board become third conductive layer 3 and fourth conductive layer 4.

A prepreg made of a unidirectionally fiber-reinforced resin material is used for an insulating layer between first conductive layer 1 and second conductive layer 2 (hereinafter, 1-2 insulating layer 7), for an insulating layer between second conductive layer 2 and third conductive layer 3 (hereinafter, 2-3 insulating layer 8), for an insulating layer between fourth conductive layer 4 and fifth conductive layer 5 (hereinafter, 4-5 insulating layer 10), and for an insulating layer between fifth conductive layer 5 and sixth conductive layer 6 (hereinafter, 5-6 insulating layer 11). The unidirectionally fiber-reinforced resin material is a material obtained by impregnating glass fibers orientated in one direction with a resin.

The fiber directions of 1-2 insulating layer 7 and 5-6 insulating layer 11 are identical, and the fiber directions of 2-3 insulating layer 8 and 4-5 insulating layer 10 are also identical. The fiber direction of 2-3 insulating layer 8 and 4-5 insulating layer 10 which are present at both sides of 3-4 insulating layer 9 of the core layer is perpendicular to the fiber direction of 1-2 insulating layer 7 and 5-6 insulating layer 11 which are present at the outside thereof. In FIG. 2, the fiber direction of 1-2 insulating layer 7 and 5-6 insulating layer 11 is in a direction perpendicular to the drawing, while the fiber direction of 2-3 insulating layer 8 and 4-5 insulating layer 10 is in a direction parallel to the drawing.

An elastic modulus, a coefficient of thermal expansion, or the like of the unidirectionally fiber-reinforced resin material significantly varies in a fiber direction compared with a direction perpendicular to the fiber. That is, the unidirectionally fiber-reinforced resin material is a material in which the mechanical characteristic in an in-plane direction component exhibits anisotropy. Because of this, if the unidirectionally fiber-reinforced resin material is used for only one layer of the interlayer insulating layers, the multilayer substrate becomes difficult to handle. On the other hand, if prepregs of the unidirectionally fiber-reinforced resin material are laminated in layers in order to take advantage of this anisotropy characteristic, it is possible to fabricate a multilayer substrate in which the mechanical characteristic of a substrate in-plane direction show the desired mechanical characteristic.

In the exemplary embodiment, prepregs of the unidirectionally fiber-reinforced resin material are arranged at upper and lower sides of 3-4 insulating layer 9 of the core layer so that mechanical characteristics in in-plane directions are symmetric with respect to the core layer. Additionally, the fiber directions of the two prepregs arranged at each side are perpendicular to each other. Because of this, considering the whole substrate, the mechanical characteristic in the in-plane direction component shows an isotropy in the multilayer-wired substrate of the exemplary embodiment. It is certainly possible that the prepregs of the unidirectionally fiber-reinforced resin material are arranged at the upper and lower sides of the core layer so that the mechanical characteristics of the in-plane directions are asymmetric with respect to the core layer (for example, the fiber directions of the insulating layers laminated in the same manner at the upper and lower sides of the core layer are not made identical) for subtly changing material constants (an elastic modulus, a coefficient of linear expansion, etc.) in a X direction and a Y direction perpendicular to each other in the substrate in-plane directions.

A known build-up method can be directly used when the multilayer-wired substrate of the exemplary embodiment is produced.

Specifically, prepared is a double-sided copper-clad resin board having copper foils laminated on both sides of a substrate obtained by impregnating glass cloth with a resin. The copper foils on both sides are etched to form wiring connected with a via. As a result, a two-layer wiring board is formed that includes third conductive layer 3, 3-4 insulating layer 9 and fourth conductive layer 4.

Further, prepregs of the unidirectionally fiber-reinforced resin material, that has vias, that have been formed, and copper foils, are stacked on the front and back sides of the two-layer wiring board and are adhered together by a thermal press. After that, each of the copper foils is etched to form wiring. Both of the prepregs are arranged so as to make their fiber directions identical at this time. As a result, a four-layer wiring board is formed that includes second conductive layer 2, 2-3 insulating layer 8, third conductive layer 3, 3-4 insulating layer 9, fourth conductive layer 4, 4-5 insulating layer 10, and fifth conductive layer 5.

Then, prepregs of the unidirectionally fiber-reinforced resin material, that has vias, that have been formed, and copper foils, are stacked on the front and back sides of the four-layer wiring board and are adhered together by a thermal press. After that, each of the copper foils is etched to form wiring. At this time, the respective prepregs are arranged so that fibers thereof are perpendicular to fibers in insulating layers 8 and 10. As a result, a six-layer wiring board (FIG. 2) of the exemplary embodiment is completed. A production method like this enables high-density wiring because wiring layers can be connected by a via having a very small diameter.

Either a thermosetting resin or a thermoplastic resin can be used for the resin material of insulating layers 7 to 11 described above. The thermosetting resin usable for the insulating layer is a polyimide, an epoxy resin or the like, while epoxy resin is preferable for manufacturing comparatively low-cost multilayer substrates. Additionally, the thermoplastic resin usable for the insulating layer is a polyether ether ketone (PEEK) type resin, a liquid crystal polymer or the like.

Further, the multilayer-wired substrate can be curved. Specifically, the produced multilayer substrate can be used in a curved state and re-formed in a curved shape by heating the multilayer substrate. In the case of re-forming the multilayer substrate in a curved shape as mentioned in the latter, it is preferable to use the thermoplastic resin for the insulating layer.

Figure 3:
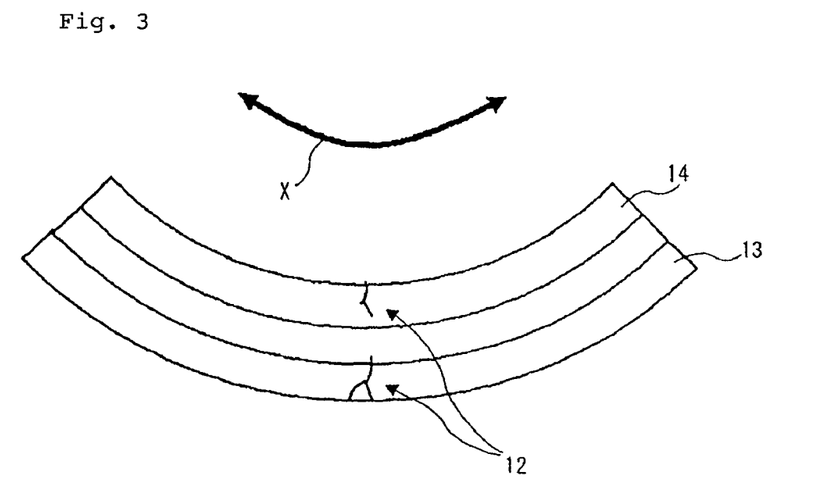

In the case of a conventional structure in which an in-plane isotropic material obtained by impregnating a glass cloth base with a resin is used for all interlayer insulating layers of a produced multilayer substrate, there is no difference between elastic moduli or coefficients of linear expansion at the front side and at the core of the multilayer substrate. Because of this, when the multilayer-wired substrate in a plane shape is curved, particularly when being curved by hot-forming of the substrate, crack 12 easily appears on insulating layer 13 at the convex side due to application of tensile stress, as shown in FIG. 3. Crack 12 also easily appears on insulating layer 14 at the concave side due to application of a compression stress.

Figure 4:
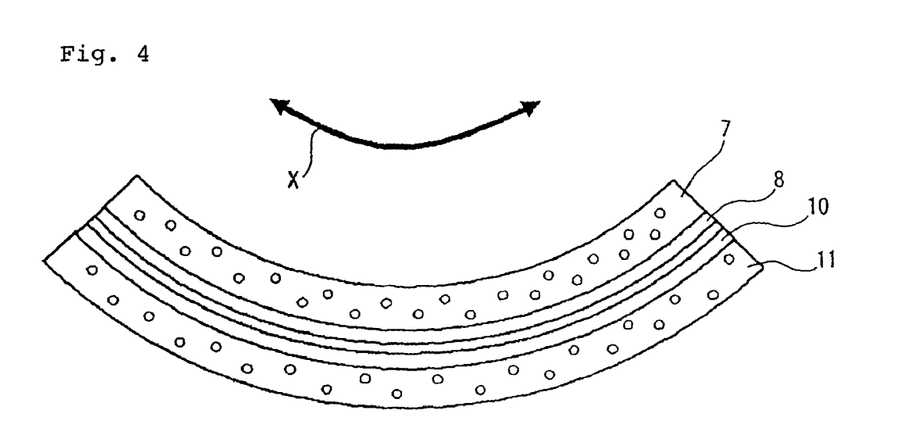

On the other hand, in the exemplary embodiment, the substrate surface is bent along the fiber direction in insulating layers 8 and 10 near the core layer as shown in FIG. 4 when the multilayer-wired substrate in a plane shape is curved. As a result, the fiber direction in insulating layer 7 arranged at a concave side and insulating layer 11 arranged at a convex side is perpendicular to the fiber direction in insulating layers 8 and 10, and therefore, deformation at the time of bending the substrate surface is not hindered. Further, glass fibers in insulating layers 7 and 11 are not broken. Compared with an insulating resin layer with glass cloth whose fibers are perpendicular to each other as a base, fluidity of resin is high at the time of melting in the unidirectionally fiber-reinforced resin material, and therefore, the resin flows at the time of hot forming and a crack does not appear in the insulating layer. Additionally, bending along the fiber direction in insulating layers 8 and 10 near the core layer enables maintaining rigidity of the substrate after curving. It is also possible to adjust the bending rigidity of the substrate by adjusting the number of fibers in insulating layers 8 and 10 as regards the bending direction X.

When the interlayer insulating layer is deformed, wiring of the conductive layer is simultaneously deformed. Because of this, it is desirable that a direction to which wiring is drawn out, of the conductive layer adjacent to the outside of the insulating layer, is preferably the same direction as the fiber direction in the insulating layer.

In the exemplary embodiment, as shown in FIG. 1, first layer wiring 15 on the top surface is a drawn-out line in a direction perpendicular to the bending direction X of the substrate. Second layer wiring 16 of an inner layer is a drawn-out line along the bending direction X of the substrate. First layer wiring 15 and second layer wiring 16 are perpendicular to each other. Because of this, the rigidity of the substrate can be maintained after the substrate is formed into a curved shape, and it will thus be difficult for the wiring of the conductive layer on the top surface to be broken. It is preferable for the same reason that wiring of sixth conductive layer 6 of the other top surface be a drawn-out line in a direction perpendicular to the bending direction X of the substrate and that wiring of fifth conductive layer 5 of an inner layer be a drawn-out line along the bending direction X of the substrate, which is not shown in FIG. 1.

While the glass fiber is described as the base of the interlayer insulating layer in the description above, the fiber is not limited to glass. Generally, glass fibers are often used for electronic substrates, while aramid fibers may be used for other than glass fibers. Further, an insulating material such as Kevlar fiber can be applied thereto. A prepreg for which these fibers are used easily ensures an interlayer insulating property and can cope with reducing the thickness of the insulating layer. Rigidity of the whole substrate is easily controlled by a diameter of the fiber or the number of fibers.

(First Exemplary Embodiment)

Figure 5:
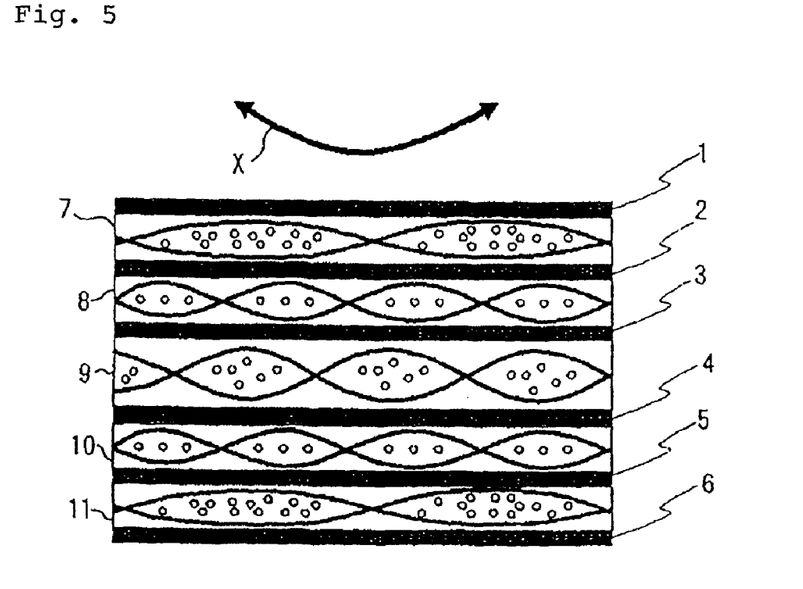
FIG. 5 is a sectional view of a multilayer-wired substrate according to another exemplary embodiment.

FIG. 5 is a sectional view of a multilayer-wired substrate according to another exemplary embodiment (a first exemplary embodiment).

The exemplary embodiment employs a multilayer-wired substrate with six wiring layers in which all insulating layers 7 to 11 interposed between the conductive layers are made of glass cloth with fibers perpendicular to each other. Even if the glass cloth is used for all the insulating layers as above, an effect similar to the prior exemplary embodiment can be obtained by changing the ratio of a vertical fiber to a horizontal fiber of the glass cloth in each of the insulating layers. A point that is different from the prior exemplary embodiment is that glass cloth, in which the mechanical characteristic in an in-plane direction component exhibits anisotropy, is used as a base in each of the insulating layers. FIG. 5 is drawn so that the number of fibers is changed in vertical and horizontal directions of the glass cloth, while the strength may be changed in the vertical and horizontal directions of the glass cloth. Accordingly, another effective way to achieve anisotropy is by changing the rigidity of the fiber in the vertical and horizontal directions of the glass cloth instead of the number of fibers. It can be considered that a cross section area of the fiber, that is, a fiber diameter, an elastic modulus, or the like is changed in the vertical and horizontal directions in order to change the fiber rigidity in the vertical and horizontal directions.

The glass cloth whose mechanical characteristic in the in-plane direction component shows an isotropy is used for a base in 3-4 insulating layer 9 of a core layer of a substrate shown in FIG. 5.

1-2 insulating layer 7 and 5-6 insulating layer 11 include more fibers in a vertical direction comparing the number of glass fibers arranged in a horizontal direction to the same surface as a paper surface of FIG. 5 in which the number of glass fibers are arranged in the vertical direction thereto. That is, the number of fibers in a direction perpendicular to the bending direction X is more than the number of fibers in the bending direction X of the substrate.

Contrary to the ratio of the vertical fiber to the horizontal fiber in 1-2 insulating layer 7 and 5-6 insulating layer 11, 2-3 insulating layer 8 and 4-5 insulating layer 10 include more fibers in the horizontal direction to the same surface as a paper surface of FIG. 5. That is, the number of fibers in the bending direction X of the substrate is more than the number of fibers in the direction perpendicular to the bending direction X.

Using the anisotropic glass cloth for the insulating layers provides an advantage in which the manufacturing method becomes almost the same as manufacturing a prepreg by using an ordinary glass cloth base. Compared with the prior exemplary embodiment, the exemplary embodiment employs a structure in which some fibers are arranged along the bending direction in insulating layers 7 and 11 near the top surfaces. Because of this, it can be said that the exemplary embodiment is effective in the case where a bending radius R is gentle or in the case where the substrate is not bent much.

(Second Exemplary Embodiment)

Figure 6:
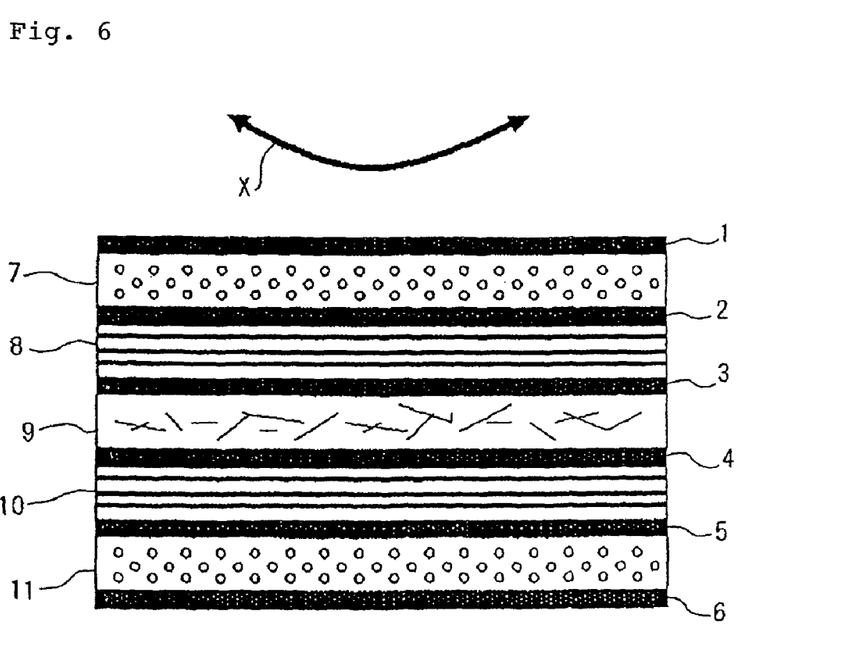
FIG. 6 is a sectional view of a multilayer-wired substrate according to another exemplary embodiment.
Figure 7:
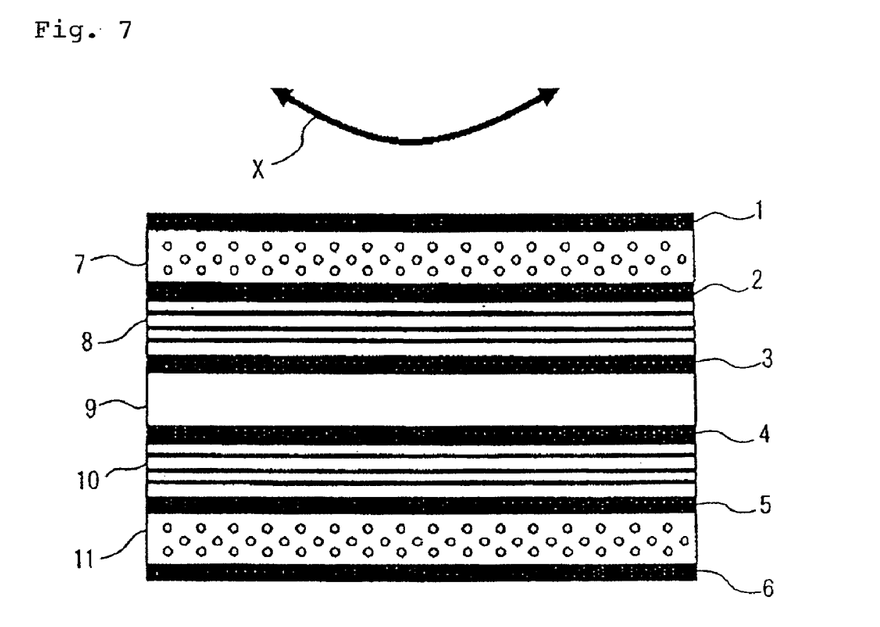
FIG. 7 is a sectional view of a multilayer-wired substrate according to another exemplary embodiment.
Figure 8:
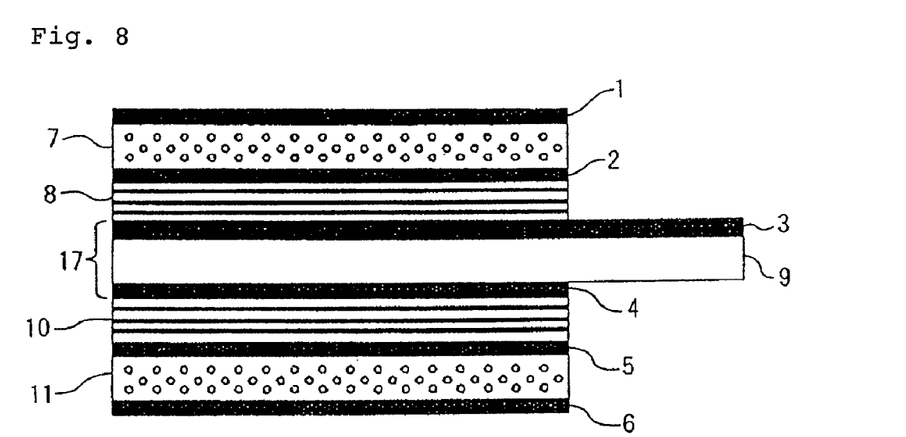
FIG. 8 is a sectional view of a multilayer-wired substrate according to another exemplary embodiment.

FIGS. 6 to 8 are sectional views showing multilayer-wired substrates according to another embodiment (a second exemplary embodiment).

Compared with the exemplary embodiment shown in FIGS. 1 and 2, the material of 3-4 insulating layer 9 (core layer) is changed in the exemplary embodiment. That is, an insulating material obtained by impregnating nonwoven cloth with a resin may be used for 3-4 insulating layer 9 as shown in FIG. 6 or only resin material can be used as shown in FIG. 7.

Additionally, by replacing a portion that includes 3-4 insulating layer 9 of the core layer, and third conductive layer 3 and fourth conductive layer 4 on both sides thereof with a double-sided flexible wiring board, such a substrate can be a rigid flexible substrate, as shown in FIG. 8. A portion that is extending laterally of the flexible wiring board is easily bent according to this rigid flexible substrate. Further, the multilayer substrate except the extended portion can be bent without damage, or can be re-formed in a curved shape similarly to the prior exemplary embodiment.

The rigid flexible substrate refers to a composite substrate obtained by laminating a rigid printed substrate on which components can be mounted and a flexible printed substrate capable of bending.

Taking into consideration the rigidity of the substrate, it is preferable to use the glass cloth base for the core layer as the exemplary embodiment in FIG. 1. However, the material of the care layer may be selected depending on uses, in the same way as the second exemplary embodiment, because the strength of the insulating layers other than the core layer is also sufficiently reinforced by the fibers.

(Third Exemplary Embodiment)

Figure 9:
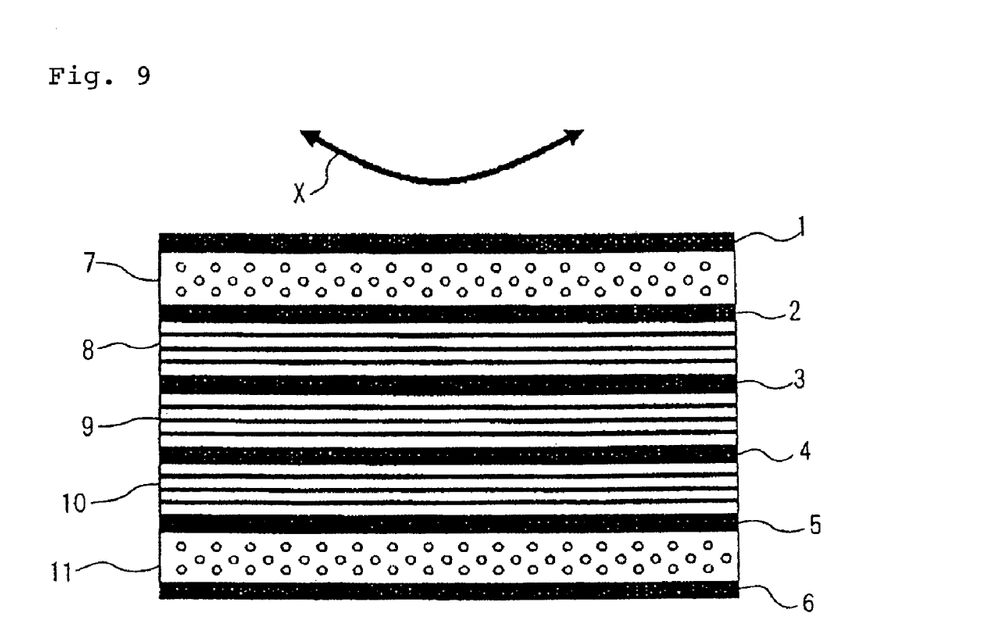
FIG. 9 is a sectional view of a multilayer-wired substrate according to another exemplary embodiment.

FIG. 9 is a sectional view showing a multilayer wiring substrate according to another exemplary embodiment (a third exemplary embodiment).

In the exemplary embodiment, 3-4 insulating layer 9 of the core layer employs a unidirectionally fiber-reinforced resin material having fibers arranged in the same direction as 2-3 insulating layer 8 and 4-5 insulating layer 10, as shown in FIG. 9. According to this multilayer-wired substrate, bending rigidity of the bending direction X can be further improved than that of the exemplary embodiment shown in FIGS. 1 and 2. On the other hand, when the multilayer-wired substrate is bent in the bending direction X, the fiber direction in insulating layers 7 and 11 at the front and back sides is perpendicular to the fiber direction in insulating layers 8, 9 and 10, so that deformation at the time of bending the substrate surface is not prevented. Because of this, elastic deformation is large and elasticity increases compared with the conventional structure that uses a prepreg with a glass cloth base for all of the insulating layers.

(Fourth Exemplary Embodiment)

Figure 10:
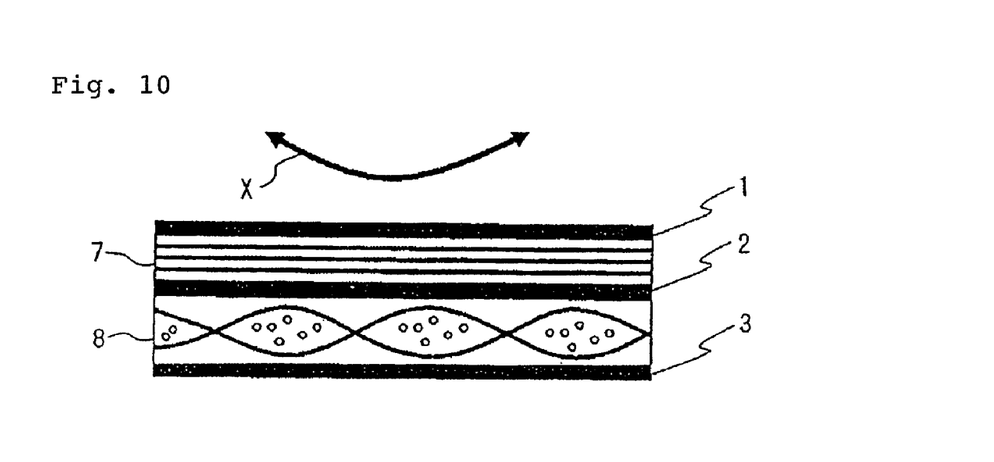
FIG. 10 is a sectional view of a multilayer-wired substrate according to another exemplary embodiment.

FIG. 10 is a sectional view showing a multilayer-wired substrate according to another exemplary embodiment (a fourth exemplary embodiment).

The multilayer-wired substrate of the exemplary embodiment is a multilayer-wired substrate having three wiring layers as shown in FIG. 10. Thus, the substrate includes first conductive layer 1, second conductive layer 2 and third conductive layer 3 in which wiring has been formed, and an insulating layer is interposed between the wiring layers adjacent to each other. The number of insulating layers is two in total.

A unidirectionally fiber-reinforced resin material is used for one insulating layer 7. A prepreg obtained by impregnating glass cloth with a resin is used for the other insulating layer 8.

The substrate having this structure becomes thinner than that of the prior exemplary embodiment, however, the rigidity of the substrate at the time of bending can be maintained by setting a direction along a fiber direction in insulating layer 7 of the unidirectionally fiber-reinforced resin material to be the bending direction X of the substrate.

Additionally, there is a difference between the elastic moduli or coefficients of linear expansion of the two insulating layers in the multilayer-wired substrate of the exemplary embodiment, and therefore only heat treatment can be used to form the substrate into a curved shape, without using a bending process, in cases where the substrate is to be reformed into a curved shape. It is also possible to control the amount of warpage in the substrate by controlling the temperature level at the time when the substrate is formed.

(Fifth Exemplary Embodiment)

Figure 11:
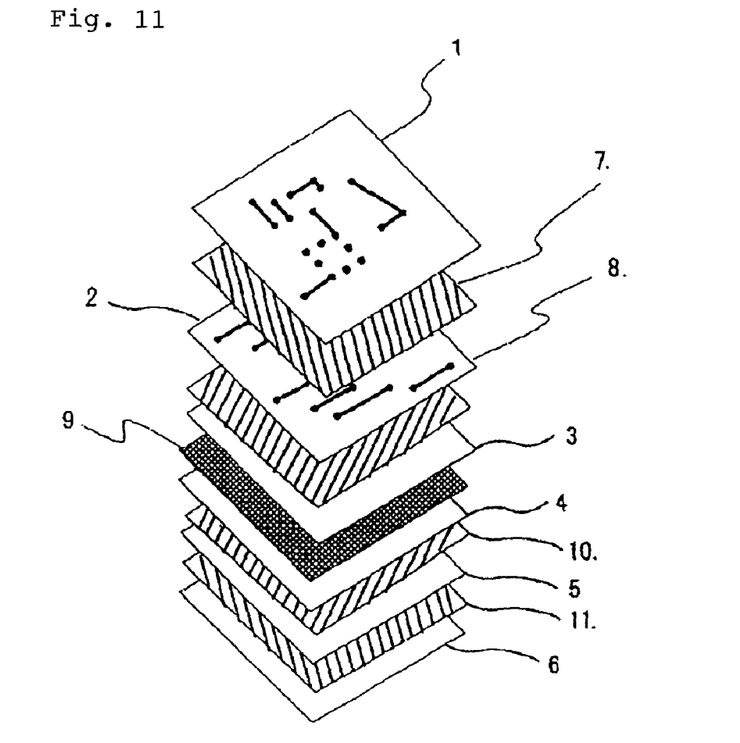
FIG. 11 is an exploded perspective view of a multilayer-wired substrate according to another exemplary embodiment.

FIG. 11 is an exploded perspective view of a multilayer-wired substrate according to another exemplary embodiment (a fifth exemplary embodiment).

In the multilayer-wired substrate in the exemplary embodiment, a prepreg of a unidirectionally fiber-reinforced resin material is used for each of four insulating layers except the core layer. The prepregs of the unidirectionally fiber-reinforced resin material are arranged at the upper and lower sides of the core layer so that mechanical characteristics in the in-plane directions are symmetric with respect to the core layer. Specifically, as shown in FIG. 11, in insulating layers which are arranged at the upper and lower sides of 3-4 insulating layer 9 of the core layer, fiber directions of 1-2 insulating layer 7 and 5-6 insulating layer 11 are the same, and the fiber directions of 2-3 insulating layer 8 and 4-5 insulating layer 10 are the same. The points described above are identical to the form shown in FIG. 1, however, the fiber directions of the two insulating layers arranged at each side of the core layer are not perpendicular to each other in this exemplary embodiment.

This configuration enables not only intensity variation in a simple orthogonal direction of the substrate in-plane direction but also a more complicated strength design.

Figure 12:
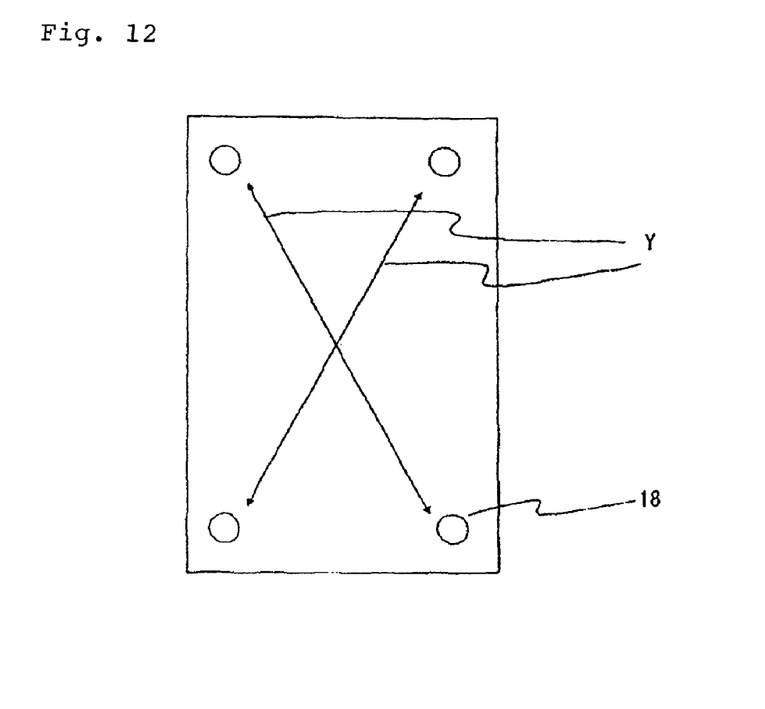
FIG. 12 is a schematic diagram showing an example of a fiber-reinforced direction of each insulating layer symmetrically arranged with respect to a core layer of the multilayer-wired substrate in FIG. 11.

For example, in the case where holes of screw for mounting are arranged at four corners of the substrate, a fiber-reinforced direction Y can be made identical to two diagonal directions across holes for mounting 18 and the strength is maintained only to the diagonal directions, as shown in FIG. 12.

The multilayer-wired substrate of the present invention illustrated in each of the exemplary embodiments can be applied to various kinds of electronic equipment. In particular, according to the multilayer-wired substrate of the present invention, it is possible to improve designing the profile design of electronic equipment such as mobile phones, digital still cameras, PDAs (Personal Digital Assistant), and laptop computers which require slim-thickness and fitness with people.

The multilayer-wired substrate of the present invention described above showing the exemplary embodiments is a multilayer-wired substrate including one or more insulating layers, wherein at least one insulating layer of the substrate is made of a material whose mechanical characteristic in an in-plane direction component exhibits anisotropy.

Other exemplary configurations of such a multilayer-wired substrate are described below.

The material showing the above described anisotropy can be a unidirectionally fiber-reinforced resin material, or can be a resin material with a fabric having fibers orientated vertically and horizontally as a base in which the anisotropy is obtained by changing the ratio of a vertical fiber to a horizontal fiber of the fabric, or can be a material whose anisotropy is obtained by changing fiber rigidity in the vertical and horizontal directions of the fabric.

It is preferable that the materials showing such an anisotropy be arranged at the upper and lower sides of the insulating layer of the core layer in the substrate so that the mechanical characteristics in the in-plane direction components are symmetric or asymmetric with respect to the core layer. Because of this, the mechanical characteristic in the in-plane direction shows an isotropy on a whole substrate and an adjustment can be made that changes the material constant in two directions perpendicular to each other in the in-plane directions.

If the anisotropic materials are arranged symmetrically to the core layer, it is preferable that unidirectionally fiber-reinforced resin materials be arranged as anisotropic material at each of the upper and lower sides of the core layer, and the fiber directions of the unidirectionally fiber-reinforced resin materials arranged at the each side of the core layer are crossed with each other.

Insulating layers near both sides of the core layer in the substrate are made of the unidirectionally fiber-reinforced resin material whose fibers are arranged along a bending direction of the substrate. In addition, insulating layers just under the conductive layer of the top layers are made of the unidirectionally fiber-reinforced resin material whose fibers are arranged in a direction perpendicular to the bending direction of the substrate. The present invention also provides a multilayer substrate that has a configuration like this.

The unidirectionally fiber-reinforced resin material used for the insulating layers as described above has properties that include significantly high strength and rigidity as regards the fiber direction. Thus, bending rigidity can be expected for three insulating layers including the core layer. In the case of bending the multilayer substrate in a plane shape, the fiber direction in the insulating layers at the top-surface side is perpendicular to the fiber direction in the insulating layers near the core layer, and therefore, deformation at the time of bending the substrate surface is not prevented. Because of this, the glass fiber is not broken even though the substrate is bent. The multilayer substrate such as this also can be used because it is in a curved shape.

Employing the following configuration is desirable in order to make this bending deformation easier. Specifically, it is preferable that a wiring direction of the conductive layers of the top layers be made identical to the fiber direction of the unidirectionally fiber-reinforced resin materials of the insulating layers just under the conductive layers, and further it is preferable that the wiring direction of conductive layers under the insulating layers be perpendicular to the wiring direction of the conductive layers of the top layers.

It is preferable that the fiber in the insulating layer be a glass fiber in the multilayer-wired substrate as described above. Accordingly, it is possible to freely adjust the substrate rigidity by adjusting the fiber direction or the number of fibers. Additionally, an interlayer insulating property is easily ensured and reducing the thickness of the insulating layer is possible because a glass fiber is interposed between the conductive layers.

The aspects of the present invention as described above can provide a multilayer-wired substrate that is a high-rigidity substrate, includes a larger elastically deformable region and has higher elasticity than those having a conventional structure, and can be curved.

While the present invention is described with reference to the exemplary embodiments, the present invention is not limited to the exemplary embodiments. Various changes and modifications understandable for those skilled in the art can be made to shapes and details of the present invention within the scope of the technical idea of the present invention.

The invention claimed is:

1. A multilayer-wired substrate comprising three or more insulating layers,
wherein a core insulating layer in the substrate is includes an unidirectionally fiber-reinforced resin material whose fiber is arranged parallel to a bending direction of the substrate, insulating layers that are on upper and lower sides of the core insulating layer in the substrate are made of the unidirectionally fiber-reinforced resin material whose fiber is arranged along a bending direction of the substrate, and further an insulating layer directly under a conductive layer of a top layer, which is different from insulating layers that are on the upper and lower sides of said core insulating layer, is made of the unidirectionally fiber-reinforced resin material whose fiber is arranged in a direction perpendicular to the bending direction of the substrate.

2. The multilayer-wired substrate according to claim 1, wherein a wiring direction of the conductive layer of the top layer is made identical to a fiber direction of the unidirectionally fiber-reinforced resin material configuring the insulating layer directly under the conductive layer.

3. The multilayer-wired substrate according to claim 2, wherein the unidirectionally fiber-reinforced resin material is a glass fiber.

4. The multilayer-wired substrate according to claim 2, wherein a wiring direction of a conductive layer under the insulating layer of an outermost layer is perpendicular to the wiring direction of the conductive layer of the top layer.

5. The multilayer-wired substrate according to claim 1, wherein the unidirectionally fiber-reinforced resin material is a material having anisotropy in two directions that are perpendicular to one another in a plane, the core insulating layer is made of an anisotropic material, whose strength in a bending direction of the substrate is higher than strength in the perpendicular directions, and the insulating layers that are on the upper and lower sides of the core insulating layer has a characteristic similar to the anisotropic material of the core insulating layer, whose strength in a bending direction of the substrate is higher than strength in the perpendicular directions, and further an insulating layer directly under a conductive layer of a top layer, which is different from the insulating layers that are on the upper and lower sides of said core insulating layer, is made of another anisotropic material, whose strength in directions perpendicular to the bending direction is higher than strength in the bending direction.

* * * * *